(12) United States Patent
Im et al.

(10) Patent No.: US 9,660,629 B2
(45) Date of Patent: *May 23, 2017

(54) DUTY CYCLE DETECTOR AND SEMICONDUCTOR INTEGRATED CIRCUIT APPARATUS INCLUDING THE SAME

(71) Applicant: SK hynix Inc., Icheon-si, Gyeonggi-do (KR)

(72) Inventors: Da In Im, Icheon-si (KR); Young Suk Seo, Icheon-si (KR)

(73) Assignee: SK hynix Inc., Icheon-Si (KR)

(*) Notice: Subject to any disclaimer, the term of this patent is extended or adjusted under 35 U.S.C. 154(b) by 262 days.

This patent is subject to a terminal disclaimer.

(21) Appl. No.: 14/457,931

(22) Filed: Aug. 12, 2014

(65) Prior Publication Data

US 2015/0323579 A1   Nov. 12, 2015

(30) Foreign Application Priority Data

May 8, 2014   (KR) .................. 10-2014-0055035

(51) Int. Cl.
 *H03K 3/017* (2006.01)
 *H03K 5/156* (2006.01)
 *G01R 29/02* (2006.01)

(52) U.S. Cl.
 CPC ......... *H03K 5/1565* (2013.01); *G01R 29/023* (2013.01)

(58) Field of Classification Search
 CPC . H03L 7/0812; H03L 7/06; H03L 7/08; H03L 7/0814; H03L 1/00; H03L 7/0816; G11C 7/222; G11C 29/023; G11C 29/028; H03K 5/1565; H03K 5/14; H03K 17/22
 See application file for complete search history.

(56) References Cited

U.S. PATENT DOCUMENTS

| | | | |
|---|---|---|---|
| 7,173,464 B2* | 2/2007 | Nagasue ............ | H03K 5/00006 327/116 |
| 8,009,492 B2* | 8/2011 | Song .................... | G11C 7/1051 365/193 |
| 2008/0164922 A1* | 7/2008 | Yun ...................... | H03K 5/1565 327/160 |
| 2010/0060334 A1 | 3/2010 | Abe et al. | |
| 2012/0154006 A1 | 6/2012 | Ahn et al. | |

* cited by examiner

*Primary Examiner* — Alesa Allgood
(74) *Attorney, Agent, or Firm* — William Park & Associates Ltd.

(57) ABSTRACT

A duty cycle detector may include a rising clock detection unit enabled in response to a first control signal; a falling clock detection unit enabled in response to a second control signal with a different activation timing from the first control signal; and a comparison unit configured to compare an output signal of the rising clock detection unit to an output signal of the falling clock detection unit in response to a comparison enable signal, and output a duty cycle detection signal.

7 Claims, 7 Drawing Sheets

DUTY CYCLE DETECTOR AND SEMICONDUCTOR INTEGRATED CIRCUIT APPARATUS INCLUDING THE SAME

CROSS-REFERENCES TO RELATED APPLICATION

The present application claims priority under 35 U.S.C. §119(a) to Korean application number 10-2014-0055035, filed on May 8, 2014, in the Korean Intellectual Property Office, which is incorporated herein by reference in its entirety.

BACKGROUND

1. Technical Field

Various embodiments relate to a semiconductor integrated circuit apparatus, and more particularly, to a semiconductor integrated circuit apparatus including a duty cycle detector.

2. Related Art

In the semiconductor circuit technology, a clock signal is used as a reference signal for adjusting operation timing in a system or circuit. When a clock signal inputted from an external device or an external system is used in the circuit or system, a clock skew is inevitably caused by an internal circuit. A semiconductor device, for example, a semiconductor memory device needs to compensate for such a clock skew and generate an internal clock signal having the same phase as the external clock signal. In order to generate the internal clock signal having the same phase as the external clock signal, the semiconductor device includes a delay locked loop (DLL) or phase locked loop (PLL) embedded therein.

Furthermore, the semiconductor device may include a duty cycle detector which receives a clock signal and detects the duty cycle of the clock signal.

SUMMARY

In an embodiment of the disclosure, there is provided a duty cycle detector configured to control a detection active period of rising and falling clocks, in response to first and second control signals with different active periods.

In an embodiment of the disclosure, a duty cycle detector may include a rising clock detection unit enabled in response to a first control signal. The duty cycle detector may also include a falling clock detection unit enabled in response to a second control signal with a different activation timing from the first control signal. The duty cycle detector may also include a comparison unit configured to compare an output signal of the rising clock detection unit to an output signal of the falling clock detection unit in response to a comparison enable signal, and output a duty cycle detection signal.

In an embodiment of the disclosure, a semiconductor integrated circuit apparatus may include a first storage unit and a second storage unit. The semiconductor integrated circuit apparatus may also include a first enable unit configured to generate a first control signal in synchronization with a rising clock. In addition, the semiconductor integrated circuit apparatus may also include a second enable unit configured to generate a second control signal according to the first control signal and a falling clock. The semiconductor integrated circuit apparatus may also include a rising clock detection unit configured to change a voltage stored in the first storage unit according to the number of rising clocks to be detected during an active period of the first control signal. Furthermore, the semiconductor integrated circuit apparatus may include a falling clock detection unit configured to change a voltage stored in the second storage unit according to the number of falling clocks to be detected during an active period of the second control signal. In addition, the semiconductor integrated circuit apparatus may include a comparison unit configured to compare the information of the first storage unit and the information of the second storage unit changed by the rising clock detection unit and the falling clock detection unit, respectively, in response to a comparison enable signal.

In an embodiment of the disclosure, there is provided a semiconductor integrated circuit apparatus including a duty cycle detector. The duty cycle detector is configured to determine a detection active period of corrected rising and falling clocks and output a duty cycle detection signal, in response to a rising strobe signal synchronized with a rising clock and a falling strobe signal generated according to the rising strobe signal and a falling clock bar signal.

In an embodiment of the disclosure, a driving method of a semiconductor integrated circuit apparatus may include changing the voltage of a precharged first output node, in response to a first control signal and a corrected rising clock; The driving method of the semiconductor integrated circuit may also include changing the voltage of a precharged second output node, in response to a second control signal with a different activation timing from the first control signal and a corrected falling clock. Further, the driving method of the semiconductor integrated circuit may also include comparing the changed voltage of the first output node to the changed voltage of the second output node after active periods of the first and second control signals, and outputting a comparison result.

In an embodiment of the disclosure, there is provided a duty cycle detector configured to control detection active periods of rising and falling clocks in response to a first control signal having an active period n times larger than a number of rising clocks and a second control signal having an active period n times larger than a number of falling clocks, where n is an integer.

DETAILED DESCRIPTION

Hereinafter, a duty cycle detector and a semiconductor integrated circuit apparatus including the same according to the disclosure will be described below with reference to the accompanying drawings through various embodiments.

Figure 1:
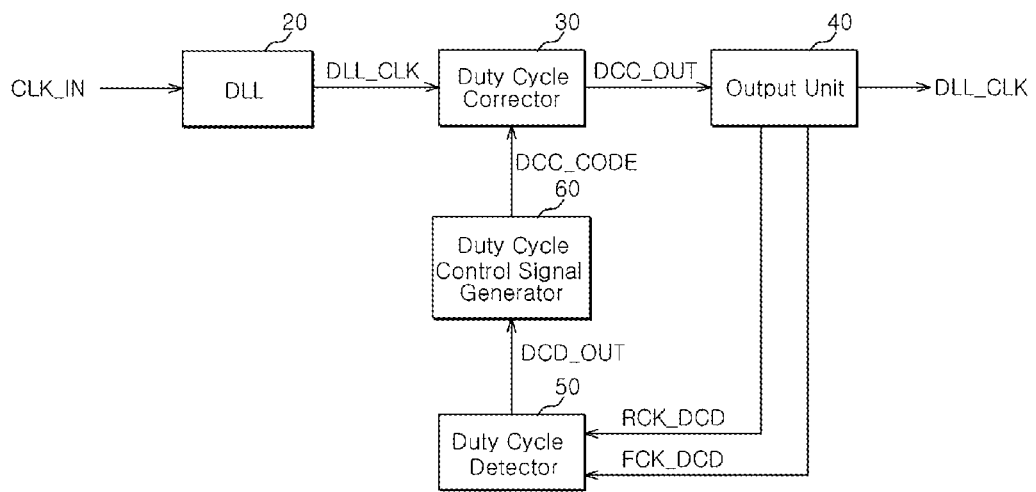
FIG. 1 is a schematic block diagram of a semiconductor integrated circuit apparatus in accordance with an embodiment of the present disclosure.

Referring to FIG. 1, a semiconductor integrated circuit apparatus 10 may include a delay locked loop (DLL) circuit 20, a duty cycle corrector 30, an output unit 40, a duty cycle detector 50, and a duty cycle control signal generator 60.

The DLL circuit 20 may be configured to determine a delay value of a delay line by detecting a phase difference between a reference clock and a feedback clock. The DLL circuit 20 may be configured to generate a DLL clock DLL_CLK by delaying the reference clock by the delay value of the delay line. The DLL circuit 20 may receive an input clock CLK_IN.

The duty cycle corrector 30 may be configured to correct the duty cycle of the DLL clock DLL_CLK in response to a duty cycle control signal DCC_CODE. The duty cycle corrector 30 may also output the corrected clock DCC_OUT.

The output unit 40 may be configured to drive the corrected clock DCC_OUT and output the driven clock as external data.

The duty cycle detector 50 may be configured to receive a corrected rising clock RCK_DCD and a corrected falling clock FCK_DCD from the output unit 40. The duty cycle detector 50 may also detect the duty cycle of the corrected clocks RCK_DCD and FCK_DCD during the active period of first and second control signals strobe_R and strobe_F, for example, a rising strobe signal and a falling strobe signal. In addition, the duty cycle detector 50 may also output the detection result as a duty cycle detection signal DCC_OUT.

The duty cycle control signal generator 60 may be configured to generate the duty cycle control signal DCC_CODE in response to the duty cycle detection signal DCC_OUT. The duty cycle control signal generator 60 may generate the duty cycle control signal DCC_CODE during the active period of the first and second control signals strobe_R and strobe_F.

Figure 2:
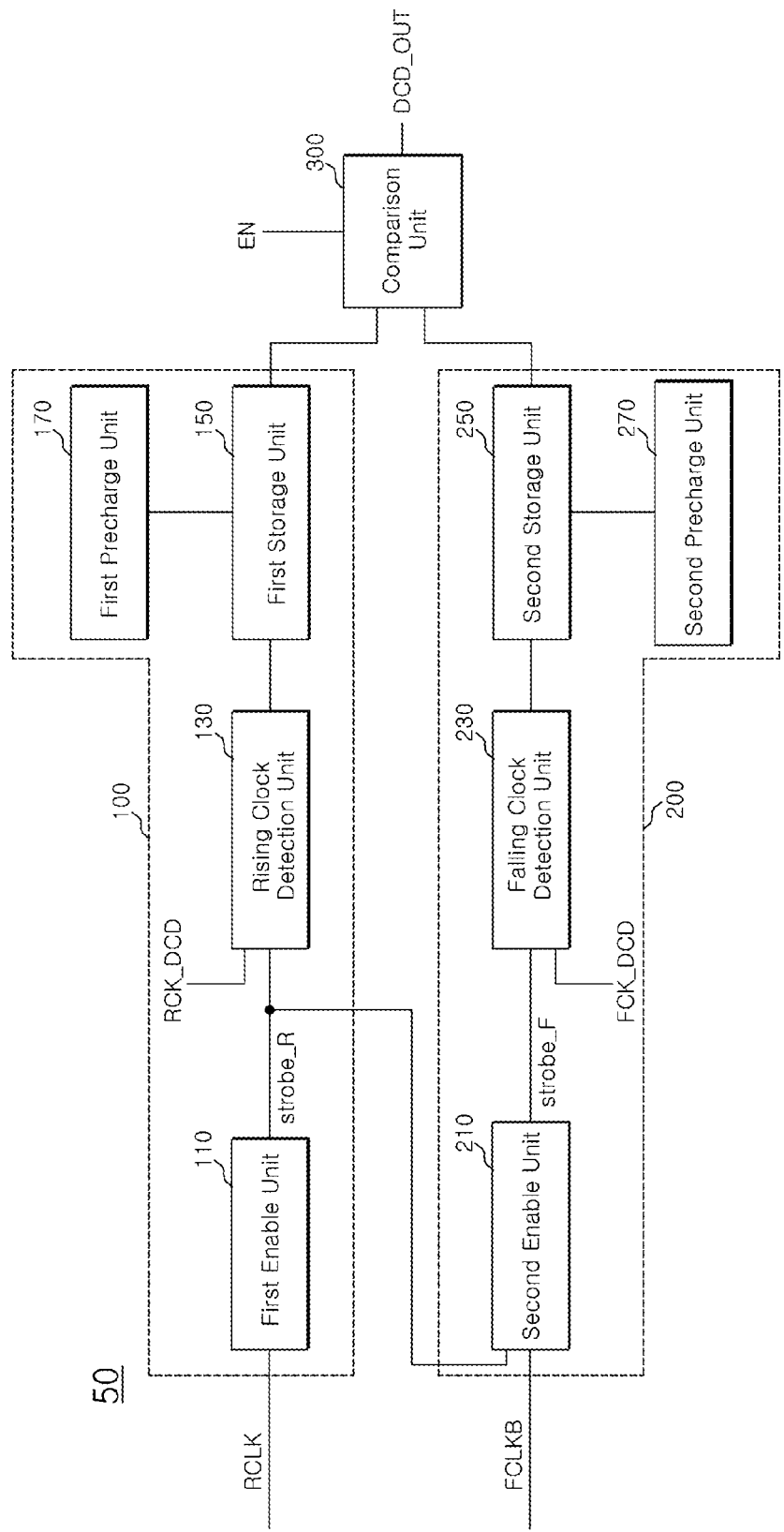
FIG. 2 is a block diagram of a duty cycle detector according to an embodiment of the disclosure.
Figure 3:
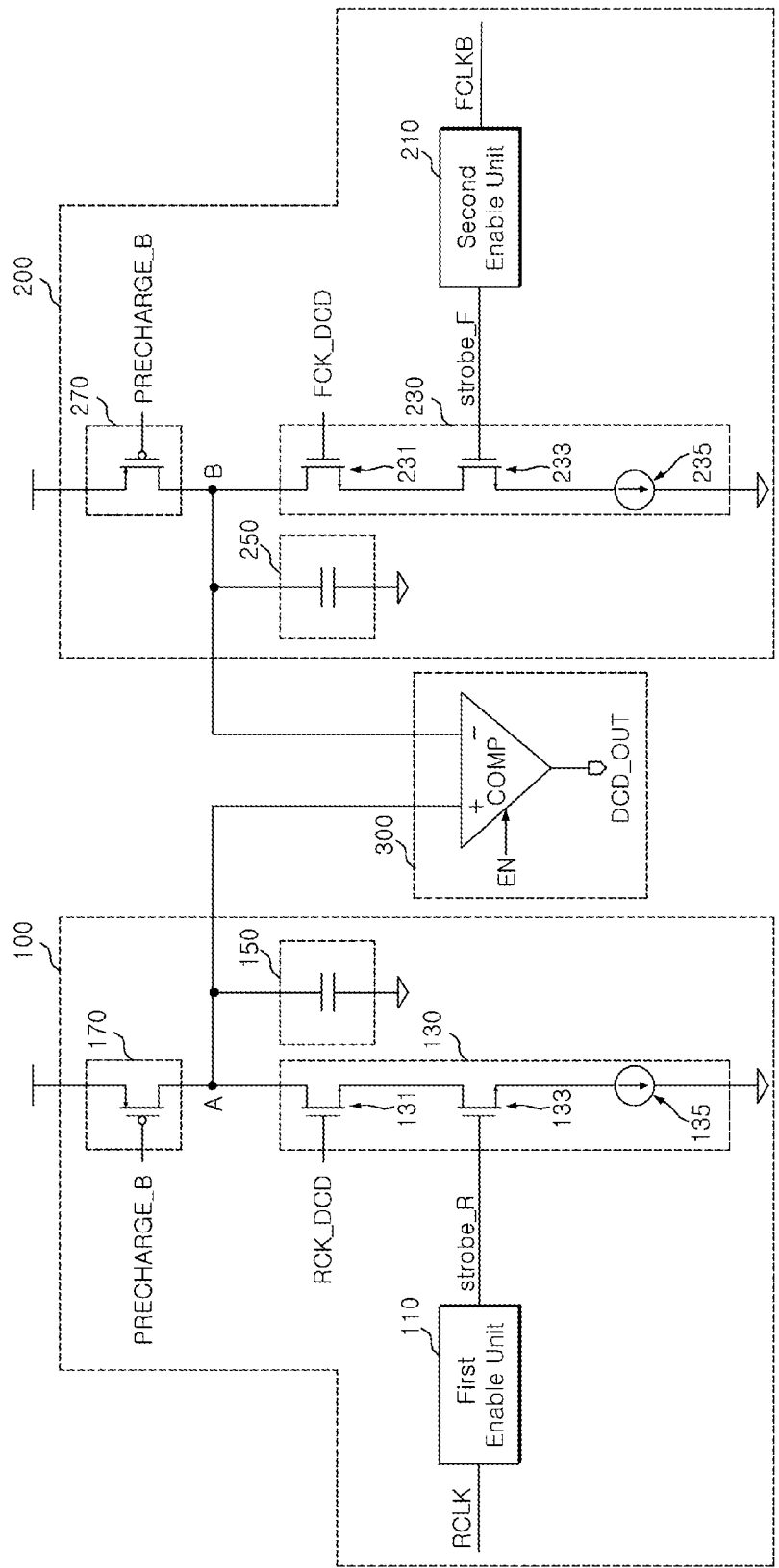
FIG. 3 is a detailed circuit diagram of the duty cycle detector according to an embodiment of the disclosure.

Referring to FIGS. 2 and 3, the duty cycle detector 50 may include a rising block 100, a falling block 200, and a comparison unit 300.

The rising block 100 may include a first enable unit 110, a rising clock detection unit 130, a first storage unit 150, and a first precharge unit 170. The first enable unit 110 may be configured to generate the first control signal strobe_R in synchronization with a rising clock RCLK. The rising clock detection unit 130 may be configured to change the voltage of the first storage unit 150 according to the number of rising clocks to be detected during the active period of the first control signal strobe_R. The first precharge unit 170 may be configured to precharge the first storage unit 150.

The falling block 200 may include a second enable unit 210, a falling clock detection unit 230, a second storage unit 250, and a second precharge unit 270. The second enable unit 210 may be configured to generate the second control signal strobe_F using the first control signal strobe_R and also a falling clock bar signal FCLKB. The second control signal strobe_F may be used to control the operation period of the falling clock detection unit 230 to prevent a cutoff of a falling clock to be detected, for instance, the corrected falling clock FCK_DCD. The falling clock detection unit 230 may be configured to change the voltage of the second storage unit 250 in response to the number of detection target falling clocks in the active period of the second control signal strobe_F.

The comparison unit 300 may be configured to compare output signals of the rising block 100 and the falling block 200 in response to a comparison enable signal EN. The comparison unit 300 may also output the duty cycle detection result. The comparison enable signal EN may be set to be activated after the active period of the first and second control signals strobe_R and strobe_F.

Figure 4:
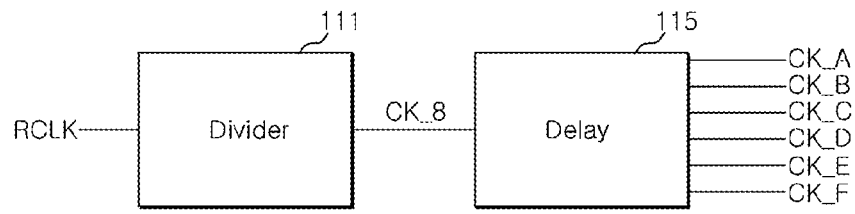
FIG. 4 is a block diagram illustrating the configuration of a first enable unit according to an embodiment of the disclosure.
Figure 4:
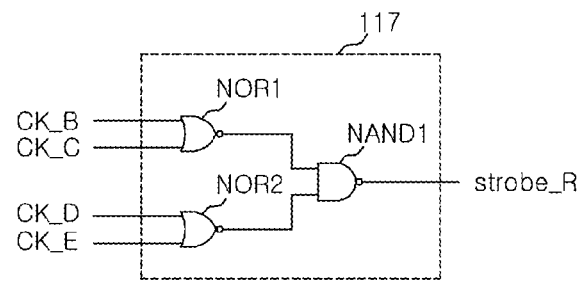

Referring to FIG. 4, the first enable unit 110 may include a divider 111 and a delay 115. The divider 111 may receive the rising clock RCLK, divide the received clock by ⅛, for instance, and generate the divided clock CK_8. The divided clock CK_8 may be inputted to the delay 115 to generate a plurality of delayed clocks CK_A, CK_B, CK_C, CK_D, CD_E, and CK_F. Referring again to FIG. 6, the plurality of delayed clocks CK_A, CK_B, CK_C, CK_D, CD_E, and CK_F may have different delay amounts.

A part of the plurality of delayed clocks, for example, the delayed clocks CK_B, CK_C, CK_D, and CD_E may be inputted to a logic circuit block 117. Further, the logic circuit block 117 may generate the first control signal strobe_R by logically combining the input clocks CK_B, CK_C, CK_D, and CK_E. The logic circuit block 117 may include a first NOR gate NOR1, a second NOR gate NOR2, and a NAND gate NAND1. The first NOR gate NOR1 may receive the delayed clocks CK_B and CK_C. The first NOR gate NOR1 may also perform a logical operation on the received clocks. The second NOR gate NOR2 may receive the delayed clocks CK_D and CK_E and perform a logical operation on the received clocks. The NAND gate NAND1 may perform a NAND operation on output signals of the first and second NOR gates NOR1 and NOR2 and generate the first control signal strobe_R.

Referring again to FIG. 3, the rising clock detection unit 130 may include a first transistor 131, a second transistor 133, and a first current source 135. The first transistor 131 may be configured to discharge the voltage stored in the first storage unit 150, that is, the voltage of a coupling node A, in response to the corrected rising clock RCK_DCD. The second transistor 133 may be electrically coupled to the first transistor 131. The second transistor 133 may be configured to discharge the output voltage of the first transistor 131 through the first current source 135 in response to the first control signal strobe_R.

Figure 5:
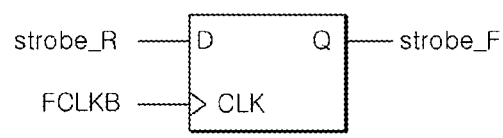
FIG. 5 is a block diagram illustrating the configuration of a second enable unit according to an embodiment of the disclosure.

Referring to FIG. 5, the second enable unit 210 may generate the second control signal strobe_F using the first control signal strobe_R and the falling clock bar signal FCLKB. For example, the second enable unit 210 may include a DQ flip-flop configured to receive the first control signal strobe_R and the falling clock bar signal FCLKB. As described above, the second control signal strobe_F may be generated on the basis of the falling clock FCLK and the first control signal strobe_R. For instance, the second control signal strobe_F may be obtained by shifting the active period of the first control signal strobe_R so that the number of input high pulses of the corrected falling clock FCK_DCD is equalized to the number of input high pulses of the corrected rising clock RCK_DCD. The second control signal strobe_F may have the same activation time as the first control signal strobe_R, but have different activation timings. In other words, the first control signal strobe_R may be set to have an active period which is n times larger than the number of rising clocks (n times larger than the number of high pulses of the rising clocks). Further, the second control signal strobe_F may be set to have an active period which is n times larger than the number of falling clocks (n times larger than the number of high pulses of the falling clocks). N is an integer which makes it possible to prevent a cutoff of the clocks.

Referring again to FIG. 3, the falling clock detection unit 230 may include a third transistor 231, a fourth transistor 233, and a second current source 235. The third transistor 231 may be configured to discharge the voltage of a coupling node B in response to the corrected falling clock FCK_DCD. The fourth transistor 233 may be electrically coupled to the third transistor 231. The fourth transistor 233 may also be configured to discharge the output voltage of the third transistor 231 to a ground terminal through the second current source 235 in response to the second control signal strobe_F.

The comparison unit 300 may be configured to compare the voltages of the first and second storage units 150 and 250, or more specifically, the voltages of the coupling nodes A and B in response to the comparison enable signal EN. The comparison unit 300 may also output the duty cycle detection signal DCD_OUT. Each of the first and second storage units 150 and 250 may include a capacitor. In addition, the comparison unit 300 may compare the voltages charged in or discharged from the first and second storage units 150 and 250. The comparison unit 300 may also output the duty cycle detection signal DCD_OUT according to the voltage difference between the first and second storage units 150 and 250. At this time, the first storage unit 150 may be precharged by the first precharge unit 170. The first precharge unit 170 may include a PMOS transistor which is driven in response to a precharge signal PRECHARGE_B. Similarly, the second storage unit 250 may be precharged by the second precharge unit 270. The second precharge unit 270 may include a PMOS transistor which is driven in response to the precharge signal PRECHARGE_B.

The duty cycle detector 50 may be configured to detect the duty cycle of the corrected rising clock in response to the first control signal strobe_R having a first active period. The duty cycle detector 50 may also detect the duty cycle of the corrected falling clock in response to the second control signal strobe_F having a second active period different from the first active period.

Figure 6:
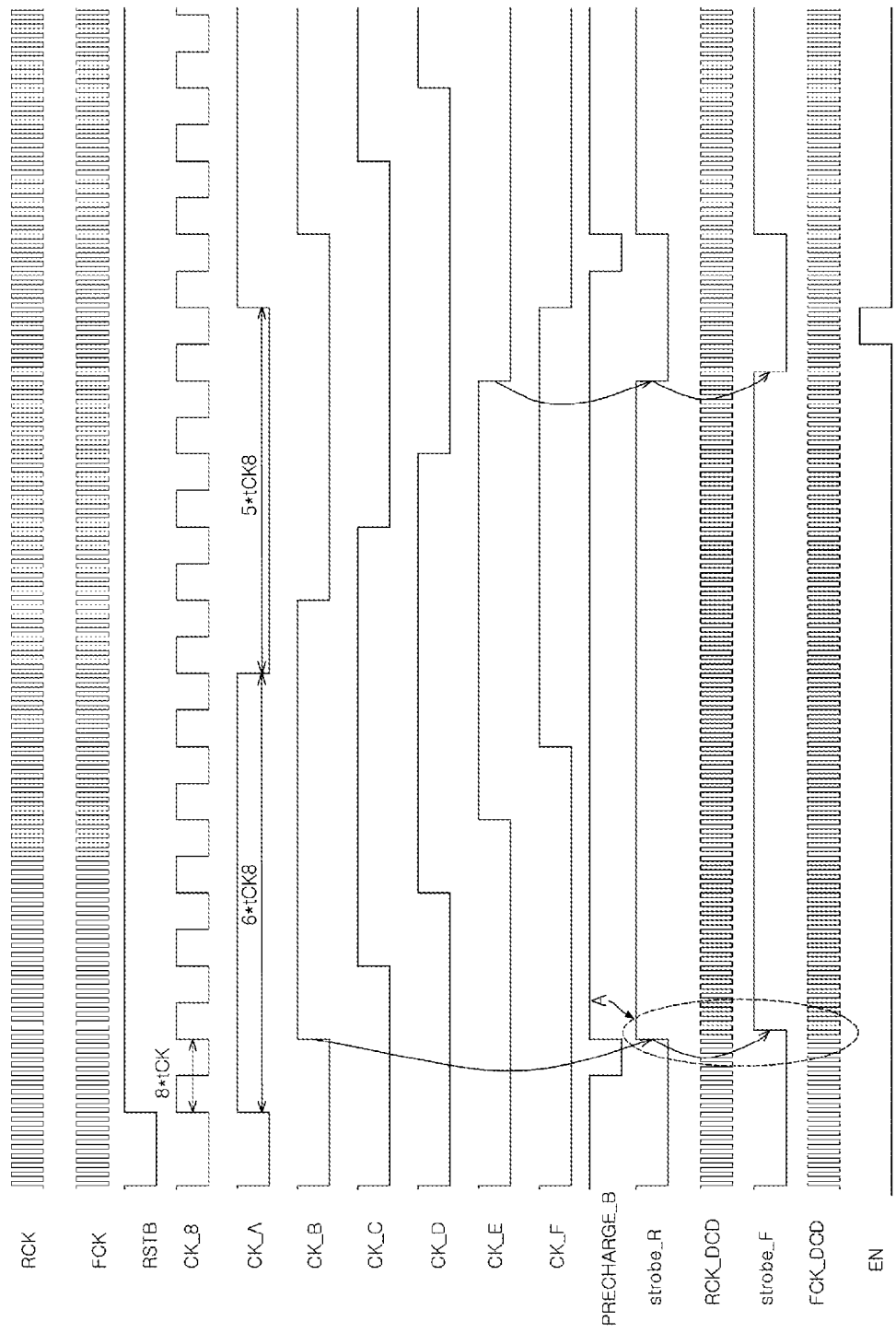
FIG. 6 is an operation timing diagram for explaining the operation of the duty cycle detector according to an embodiment of the disclosure.
Figure 7:
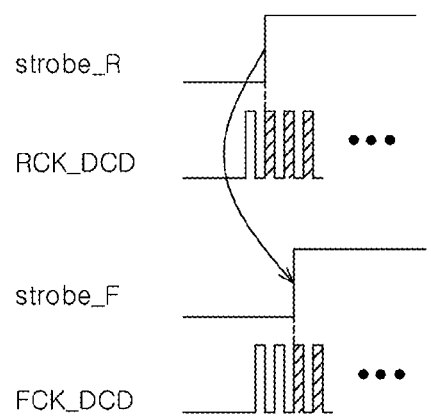
FIG. 7 is an expanded timing diagram of a portion A of FIG. 6.

More specifically, as shown in FIGS. 6 and 7, the activation timing of the second control signal strobe_F may be set differently from the activation timing of the first control signal strobe_R to prevent a cutoff of a high pulse of the corrected falling clock FCK_DCD. Thus, the duty cycles of the corrected rising clock RCK_DCD and the corrected falling clock FCK_DCD may be measured under the same high-pulse condition.

Referring to FIG. 6, the comparison enable signal EN may be set to be activated after the active periods of the first and second control signals strobe_R and strobe_F. Accordingly, the duty cycle detector 50 may perform the detection operation for the corrected rising clock RCK_DCD and the corrected falling clock FCK_DCD separately from the comparison operation for the corrected rising clock RCK_DCD and the corrected falling clock FCK_DCD. Therefore, the duty cycle detector 50 may additionally prevent a duty cycle offset which may occur when the detection operation and the comparison operation are performed at the same time. FIG. 6 also illustrates a reset bar signal RSTB.

Figure 8:
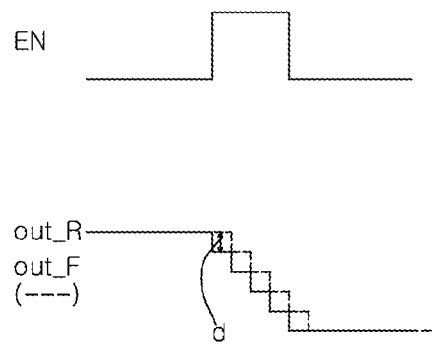
FIG. 8 is an operation timing diagram for explaining a comparison operation of the duty cycle detector according to an embodiment of the disclosure.

Referring to FIG. 8, the duty cycle comparison operation may be performed by detecting a difference d between an output voltage out_R of the coupling node A and an output voltage out_F of the coupling node B during the active operation of the comparison enable signal EN. When the difference d between the output voltage out_R of the coupling node A and the output voltage out_F of the coupling node B is changed, a duty cycle distortion may be detected as a result.

According to an embodiment of the disclosure, the duty cycle detector 50 may be configured to detect the duty cycle of the corrected rising clock in response to the first control signal strobe_R having the first active period. The duty cycle detector 50 may also detect the duty cycle of the corrected falling clock in response to the second control signal strobe_F having the second active period different from the first active period. Accordingly, the duty cycle detector may detect an accurate duty cycle. Furthermore, the duty cycle detector may be configured to separately perform the detection operation and the comparison operation, thereby preventing an additional duty cycle offset.

Figure 9:
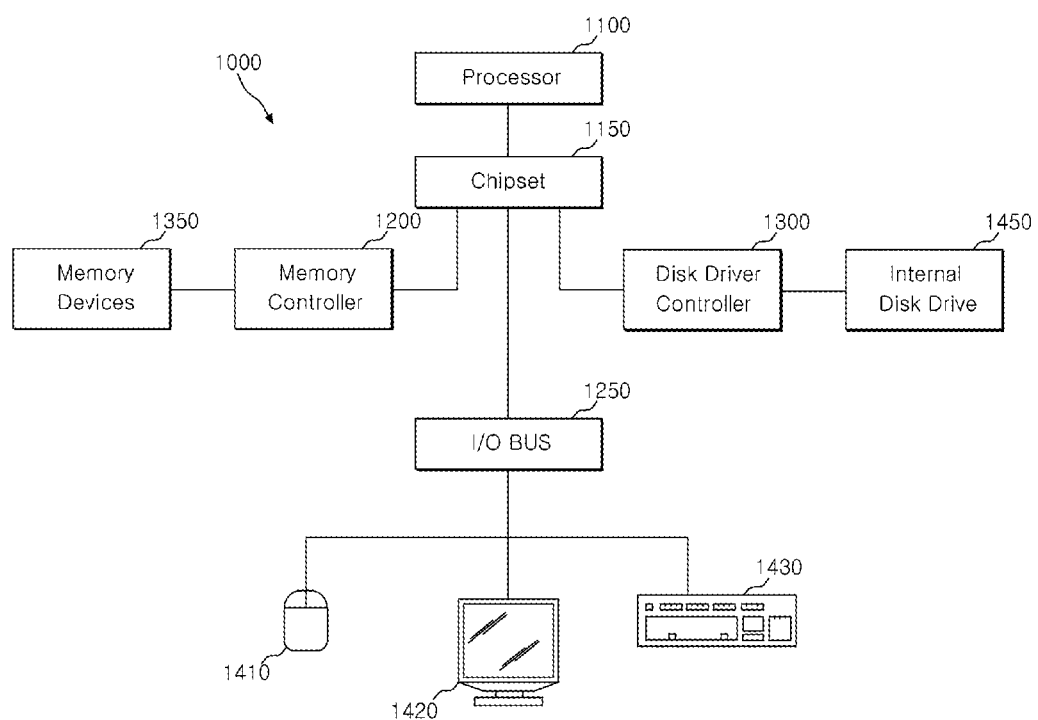
FIG. 9 illustrates a block diagram of a system employing a memory controller circuit in accordance with an embodiment of the invention.

Referring to FIG. 9, a system 1000 may include one or more processors 1100. The processor 1100 may be used individually or in combination with other processors 1100. A chipset 1150 may be operably electrically coupled to the processor 1100. The chipset 1150 is a communication pathway for signals between the processor 1100 and other components of the system 1000. The other components of the system 1000 may include a memory controller 1200, an input/output ("I/O") bus 1250 and a disk drive controller 1300. Depending on the configuration of the system 1000, any one of a number of different signals may be transmitted through the chipset 1150.

The memory controller 1200 may receive a request provided from the processor 1100 through the chipset 1150. The memory controller 1200 may be operably electrically coupled to one or more memory devices 1350. The memory devices 1350 may include the semiconductor integrated circuit apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus may employ any one of a number of communications protocols to communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of examples only. Accordingly, the semiconductor integrated circuit apparatus described should not be limited based on the described embodiments. Rather, the semiconductor integrated circuit apparatus described should only be limited in light of the claims that follow when taken in conjunction with the above description and accompanying drawings.

What is claimed is:
1. A duty cycle detector, comprising:
   a first storage unit;
   a second storage unit;
   a first enable unit configured to generate a first control signal in synchronization with a rising clock;

a second enable unit configured to generate a second control signal according to the first control signal and a falling clock;

a rising clock detection unit configured to change a voltage stored in the first storage unit according to the number of rising clocks to be detected during the enabling of the first control signal;

a falling clock detection unit configured to change a voltage stored in the second storage unit according to the number of falling clocks to be detected during the enabling of the second control signal; and a comparison unit configured to compare the information of the first storage unit and the information of the second storage unit, changed by the rising clock detection unit and the falling clock detection unit, respectively, in response to a comparison enable signal.

2. The duty cycle detector according to claim 1, wherein the comparison enable signal is activated after the first and second control signals.

3. The duty cycle detector according to claim 1, further comprising:
a first precharge unit configured to precharge the first storage unit for a predetermined time, in response to a precharge signal; and
a second precharge unit configured to precharge the second storage unit for the predetermined time, in response to the precharge signal.

4. The duty cycle detector according to claim 1,
wherein the first enable unit comprises:
a divider configured to receive the rising clock and generate a divided clock;
a delay configured to receive the divided clock and generate a plurality of delayed clocks; and
a logic circuit configured to perform a logical operation on a part of the plurality of delayed clocks and generate the first control signal.

5. The duty cycle detector according to claim 4,
wherein the second enable unit receives the first control signal and an inverted signal of the falling clock, and outputs the second control signal.

6. A semiconductor integrated circuit apparatus comprising:
a duty cycle detector configured to generate a duty cycle detection signal;
a DLL circuit configured to detect a phase difference between a reference clock and a feedback clock and generate a DLL clock;
a duty cycle corrector configured to correct the duty cycle of the DLL clock in response to a duty cycle control signal, and output a corrected rising clock and a corrected falling clock; and
a duty cycle control signal generator configured to generate a duty cycle control signal in response to the duty cycle detection signal, during active periods of a rising strobe signal and a falling strobe signal,
wherein the duty cycle detector comprises:
a first storage unit;
a second storage unit;
a first enable unit configured to generate the rising strobe signal;
a second enable unit configured to generate the falling strobe signal;
a rising clock detection unit configured to change a voltage stored in the first storage unit according to the number of rising clocks to be detected during the enabling of the rising strobe signal;
a falling clock detection unit configured to change a voltage stored in the second storage unit according to the number of falling clocks to be detected during the enabling of the falling strobe signal; and
a comparison unit configured to compare the information of the first storage unit and the information of the second storage units changed by the rising clock detection unit and the falling clock detection unit, respectively, in response to a comparison enable signal.

7. The semiconductor integrated circuit apparatus according to claim 6, wherein the comparison enable signal is activated after the rising strobe signal and the falling strobe signal.

* * * * *